(12) United States Patent
Mishra

(10) Patent No.: US 11,034,861 B2
(45) Date of Patent: *Jun. 15, 2021

(54) POLISHING COMPOSITIONS CONTAINING CHARGED ABRASIVE

(71) Applicant: Fujifilm Electronic Materials U.S.A., Inc., N. Kingstown, RI (US)

(72) Inventor: Abhudaya Mishra, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/535,360

(22) Filed: Aug. 8, 2019

(65) Prior Publication Data

US 2019/0359857 A1    Nov. 28, 2019

Related U.S. Application Data

(63) Continuation of application No. 15/725,855, filed on Oct. 5, 2017, now Pat. No. 10,428,241.

(51) Int. Cl.
*C09G 1/02* (2006.01)
*H01L 21/3105* (2006.01)
*C09K 3/14* (2006.01)

(52) U.S. Cl.
CPC .............. *C09G 1/02* (2013.01); *C09K 3/1409* (2013.01); *H01L 21/31053* (2013.01)

(58) Field of Classification Search
None
See application file for complete search history.

(56) References Cited

U.S. PATENT DOCUMENTS

| 7,071,105 | B2 | 7/2006 | Carter et al. |
| 7,306,637 | B2 | 12/2007 | Cherian et al. |
| 7,442,645 | B2 | 10/2008 | Carter et al. |
| 7,504,044 | B2 | 3/2009 | Carter et al. |
| 7,531,105 | B2 | 5/2009 | Dysard et al. |
| 7,846,842 | B2 | 12/2010 | Carter et al. |
| 8,043,970 | B2 | 10/2011 | Lee et al. |

(Continued)

FOREIGN PATENT DOCUMENTS

| CN | 1742066 | 3/2006 |
| CN | 101802125 | 8/2010 |

(Continued)

OTHER PUBLICATIONS

The European Search Report for European Application No. EP 18 18 5990 dated Feb. 25, 2019.

(Continued)

*Primary Examiner* — Roberts P Culbert
(74) *Attorney, Agent, or Firm* — Fish & Richardson P.C.

(57) ABSTRACT

Polishing compositions that can selectively and preferentially polish certain dielectric films over other dielectric films are provided herein. These polishing compositions include either cationic or anionic abrasives based on the target dielectric film to be removed and preserved. The polishing compositions utilize a novel electrostatic charge based design, where based on the charge of the abrasives and their electrostatic interaction (forces of attraction or repulsion) with the charge on the dielectric film, various material removal rates and polishing selectivities can be achieved.

20 Claims, 5 Drawing Sheets

(56) References Cited

U.S. PATENT DOCUMENTS

| | | | |
|---|---|---|---|
| 8,138,091 B2 | 3/2012 | Dysard et al. | |
| 8,197,782 B2 | 6/2012 | DeVera | |
| 8,486,169 B2 | 7/2013 | Carter et al. | |
| 9,558,959 B2 | 1/2017 | Mishra et al. | |
| 9,583,359 B2 | 2/2017 | Mishra et al. | |
| 9,735,030 B2 | 8/2017 | Wang et al. | |
| 9,735,031 B2 | 8/2017 | Wang et al. | |
| 10,428,241 B2 * | 10/2019 | Mishra | H01L 21/31053 |
| 2004/0152309 A1 | 8/2004 | Carter et al. | |
| 2006/0099814 A1 | 5/2006 | Carter et al. | |
| 2009/0081871 A1 | 3/2009 | Dysard et al. | |
| 2010/0001229 A1 | 1/2010 | Nakagawa et al. | |
| 2012/0264304 A1 | 10/2012 | Ward | |
| 2013/0146804 A1 | 6/2013 | Mizuno et al. | |
| 2013/0200038 A1 | 8/2013 | Li et al. | |
| 2015/0044872 A1 | 2/2015 | Saeki et al. | |
| 2015/0284593 A1 | 10/2015 | Wang et al. | |
| 2015/0376458 A1 | 12/2015 | Grumbine et al. | |
| 2016/0222254 A1 | 8/2016 | Huang et al. | |
| 2016/0288289 A1 | 10/2016 | Suzuki et al. | |
| 2017/0210946 A1 | 7/2017 | Lam et al. | |
| 2019/0106596 A1 | 4/2019 | Mishra | |

FOREIGN PATENT DOCUMENTS

| | | | |
|---|---|---|---|
| CN | 105555901 | 5/2016 | |
| EP | 2 927 294 | 10/2015 | C09G 1/00 |
| EP | 3 121 239 | 1/2017 | B24B 37/00 |
| JP | 2005-162533 | 6/2005 | |
| JP | 2006-520530 | 9/2006 | |
| JP | 2008-519466 | 6/2008 | |
| JP | 2009-206148 | 9/2009 | |
| JP | 2010-269985 | 12/2010 | |
| JP | 2012-40671 | 3/2012 | |
| JP | 2015-201644 | 11/2015 | |
| JP | 2017-524770 | 8/2017 | |
| KR | 1020050098288 | 10/2005 | |
| KR | 1020070085738 | 8/2007 | |
| KR | 1020150115645 | 10/2015 | |
| KR | 1020170021320 | 2/2017 | |
| TW | 200426932 | 12/2004 | |
| TW | 200918658 | 5/2009 | |
| TW | 201542785 | 11/2015 | |
| WO | WO 2009/056491 | 5/2009 | C09G 1/02 |
| WO | WO 2015/040979 | 3/2015 | |
| WO | WO 2016/039265 | 3/2016 | C09K 3/14 |

OTHER PUBLICATIONS

The Extended European Search Report for European Application No. EP 18185990 dated Jul. 16, 2019.

The Notification of Transmittal of the International Search Report and Written Opinion of the International Searching Authority for International Application No. PCT/US2018/052804 dated Dec. 11, 2018.

Notification of First Office Action issued by the Chinese Patent Office for Chinese Application No. CN 201810329068.2 dated Dec. 1, 2020 (with English Translation).

Office Action and Search Report for Taiwan Application No. TW 107107919 dated Dec. 30, 2020 (With English summary).

Office Action and Search Report for Japanese Patent Application No. 2018-188440 dated Mar. 8, 2021 (with English Translation).

* cited by examiner

POLISHING COMPOSITIONS CONTAINING CHARGED ABRASIVE

CROSS-REFERENCE TO RELATED APPLICATIONS

The present application is a continuation of U.S. Utility application Ser. No. 15/725,855, filed on Oct. 5, 2017, the contents of which are hereby incorporated by reference in their entirety.

FIELD OF THE DISCLOSURE

This invention relates to polishing compositions, and methods for polishing semiconductor substrates using the same. More particularly, this invention relates to chemical mechanical polishing compositions and methods for selectively removing certain dielectric layers from a semiconductor substrate.

BACKGROUND OF THE DISCLOSURE

The semiconductor industry is continually driven to improve chip performance by further miniaturization of devices by process and integration innovations. Chemical Mechanical Polishing/Planarization (CMP) is a powerful technology as it makes many complex integration schemes at the transistor level possible, thereby increasing chip density. Not surprisingly, there are a multitude of new CMP steps and requirements at the Front End of Line (FEOL) transistor fabrication step. The FEOL material stack typically includes a metal gate and multiple stacks of dielectric materials. The prevalently used dielectric films are Silicon Nitride (SiN), Silicon Oxide ($SiO_2$ or TEOS), Poly-silicon (P—Si), Silicon Carbon Nitride (SiCN), Spin On Carbon (SOC) carbon hard mask, and low-k/ultra-low k (SiCOH, SiOC) dielectric films. With the introduction of high-k metal gate technology at 45 nm and FinFET technology at 22 nm chip production by Intel Corporation, SiN, $SiO_2$, SiCN and P—Si films started being used more profusely, and in a greater number of applications in FEOL. Additionally, in Back End of Line (BEOL) applications, with resistivity of conventional barrier materials (Ta/TaN; Ti/TiN) not scaling down for advanced sub-10 nm manufacturing nodes, semiconductor companies are using dielectrics such as SiN, $SiO_2$, and P—Si for various BEOL material stacks. For both FEOL and BEOL, these dielectric films can be used as an etch stop layer, capping material, spacer material, additional liner, diffusion/passivation barrier, hard mask and/or stop-on layer.

SUMMARY OF THE DISCLOSURE

Thus, dielectric films are being used much more profusely in advanced semiconductor manufacturing. From a CMP perspective, most of these integrations incorporating dielectrics require polishing compositions (slurries) that can work/polish (or stop) on either two or three of these films. For example, it is desirable to develop a slurry that can remove SiN and not remove (stop on) $SiO_2$/P—Si or a slurry that can remove $SiO_2$ and not remove (stop on) SiN. For designing such systems with multiple requisites, the traditional approach has been to add some chemical enhancers or inhibitors that can enhance or inhibit the rates of one or more of these dielectric films. A classic example is Shallow Trench Isolation (STI) slurries that use amino acids as chemicals that further inhibit the rates of SiN in formulations containing ceria abrasive. These STI slurries polish TEOS selective to SiN, and display high TEOS rates and stop (or have near to zero polish rates) on SiN films.

It is noteworthy that dielectric (SiN, TEOS, P—Si) films, albeit solid surfaces, have electrostatic charges. The charge (positive, negative or zero) manifests itself as zeta potential, and varies with pH. Similarly, abrasives (for example silica) as colloidal dispersions have their own charges and zeta potential values that vary with pH. Furthermore, these abrasives can be surface modified to exhibit negative zeta potential (e.g., anionic silica) or positive zeta potential (e.g., cationic silica). Thus, both the abrasives and dielectric films have electrostatic charges, and if an abrasive and a dielectric film have dissimilar charges (positive vs. negative) at a particular pH, there will be attraction between the two that will consequently lead to high removal rates of that particular film using that particular abrasive. Conversely, if an abrasive and a dielectric film have similar charges (either both positive or both negative), there will be repulsion forces between the two, leading to low (e.g., close to zero) removal rates and stopping on that dielectric film using that particular abrasive. Thus, the electrostatic attraction and repulsion are driven by the surface charge (among other things) and thus by the liquid slurry/abrasive zeta potential and the zeta potential of the solid dielectric surface. This disclosure teaches a design of polishing compositions (slurries) containing charged abrasives for selectively and preferentially polishing substrates containing multiple dielectric films such as silicon nitride, silicon oxide, poly-silicon, silicon carbon nitride, and low/ultra-low k dielectric films. This CMP slurry design is primarily based on taking advantage of electrostatic forces of attraction and/or repulsion between the abrasive and the dielectric films.

In general, the present disclosure relates to aqueous polishing compositions that can selectively and preferentially polish some dielectric films over others in substrate containing multiple dielectric films. More particularly, the present disclosure discusses designing of polishing compositions (slurries) for selective material removal based on the surface charge of the abrasives and the surface charge of the dielectric films. If the surface charge of the abrasive has the same polarity as that of the dielectric film, the two materials repel, thereby decreasing the removal rates (RRs) of the dielectric film. Conversely, if the surface charge of the abrasive has a polarity opposite to that of the dielectric film, then, there are attraction forces between the two materials and RRs of that dielectric film increase. This concept of surface charged based attraction/repulsion forces and RRs depending on these forces is illustrated in FIG. 1. As can be seen in FIG. 1, using charged abrasives (e.g., anionic or cationic silica) can help design systems for selectively removing a dielectric material versus another dielectric material. For example, in FIG. 1, Case I shows that by using anionic silica (negatively charged silica with a negative zeta potential), polishing compositions can selectively polish SiN dielectric (which has a positive zeta potential) at high RRs, and simultaneously polish $SiO_2$/low-k/P—Si dielectric materials (which have a negative zeta potential) at very low removal rates. Conversely, in FIG. 1, Case II shows that by using cationic silica (positively charged silica with a positive zeta potential), polishing compositions can selectively polish $SiO_2$/low-k/P—Si dielectric materials at high RRs (due to attraction forces), and simultaneously polish SiN dielectric at very low RRs. In some embodiments, this charge based design concept can be applicable for the acidic 2-7 pH range.

The concept of designing slurries for polishing dielectrics based on the charge of the abrasive is further summarized in the table in FIG. 1. As can be seen from the Table in FIG. 1, SiN films can be selectively and preferentially polished over other dielectrics using anionic abrasives (Case I) whereas $SiO_2$/low-k/P—Si dielectric films can be selectively and preferentially polished over SiN films using cationic abrasives (Case II).

Thus, in one aspect, the present disclosure provides a polishing composition. The composition includes an anionic abrasive, an acid/base pH adjuster and water. The polishing composition has a pH of about 2 to about 7. In this embodiment, by using an anionic abrasive, a polishing composition can selectively and preferentially polish SiN over $SiO_2$/low-k/P—Si films (FIG. 1: Case I). For example, the polishing composition can exhibit a first rate of removal of silicon nitride, a second rate of removal of polysilicon, and a ratio of the first rate to the second rate is at least about 2:1.

In another aspect, the present disclosure provides a polishing method that includes (a) applying a polishing composition to a substrate having silicon nitride and polysilicon on its surface, and (b) bringing a pad into contact with the substrate and moving the pad in relation to the substrate. The composition includes an anionic abrasive, an acid/base pH adjuster and water. The polishing composition has a pH of about 2 to about 7. The method can remove at least a portion of silicon nitride at a first rate, the method removes at least a portion of polysilicon at a second rate, and a ratio of the first rate to the second rate is at least about 2:1.

In another aspect, the present disclosure provides polishing compositions and polishing methods that polish $SiO_2$/low-k/P—Si films with high selectivity and high polishing rates over SiN dielectric films. The polishing composition can include a cationic abrasive, an acid/base pH adjuster and water. The polishing composition has a pH of about 2 to about 7. In this embodiment, using a cationic abrasive, a polishing composition can selectively and preferentially polish $SiO_2$/low-k/P—Si films over SiN (FIG. 1: Case II). In some embodiments, the cationic abrasive can include alumina, silica, titania, zirconia, a co-formed product thereof, or a mixture thereof. In some embodiments, the cationic abrasive can include ceria having a mean particle size of from about 1 nm to about 5000 nm. In some embodiments, the polishing composition containing a cationic abrasive is substantially free of a halide salt.

In yet another aspect, this disclosure provides a polishing method that includes (a) applying a polishing composition to a substrate having silicon nitride and at least one of silicon oxide and polysilicon on a surface of the substrate, wherein the composition includes a cationic abrasive, an acid or base, and water, and the composition has a pH of about 2 to about 7; and (b) brining a pad into contact with the substrate and moving the pad in relation to the substrate. The method removes at least a portion of at least one of silicon oxide and polysilicon at a first rate, the method removes at least a portion of silicon nitride at a second rate, and a ratio of the first rate to the second rate is at least about 2:1.

In yet another aspect, the present disclosure provides polishing compositions containing anionic/cationic abrasives having a long shelf life, with respect to the usable time period and/or expiration date of the composition. Particularly, the colloidal dispersion stability as measure by the zeta potential of polishing compositions containing anionic/cationic abrasives is compared and contrasted to compositions having normal/non-ionic colloidal silica. In general, normal/non-ionic colloidal silica is unsuitable (by itself) for use in the acidic pH regime for polishing dielectric films. Thus, polishing compositions containing anionic/cationic abrasives are far superior to non-ionic silica for use in polishing a substrate containing multiple dielectrics due to superior composition stability of charged abrasives in acidic pH regime.

In yet another aspect, the compositions of the present disclosure can be diluted at the point of use (POU) (i.e., before going on the polishing tool) without changing the CMP performance. For example, the concentrated polishing composition can be 2× of POU. When CMP is performed by diluting the 2× with water to reach components' concentration of 1× formulated slurry at POU, there is no deterioration in performance of the concentrate formulation (2×) versus the diluted formulation (1×). More concentrated polishing compositions (such as 3×, 5×, 10×, etc.) can be prepared using similar methodology.

Embodiments can include one or more of the following features:

In some embodiments, the composition containing a cationic abrasive can have a first rate of removal of silicon oxide or polysilicon, a second rate of removal of silicon nitride, and a ratio of the first rate to the second rate is at least about 2:1 (e.g., at least about 8:1).

In some embodiments, the composition containing an anionic abrasive can have a first rate of removal of silicon nitride, a second rate of removal of polysilicon, and a ratio of the first rate to the second rate is at least about 2:1 (e.g., at least about 8:1).

In some embodiments, the cationic or anionic abrasive can include ceria, alumina, silica, titania, zirconia, a co-formed product thereof, or a mixture thereof. In some embodiments, the cationic or anionic abrasive can include colloidal alumina, colloidal silica, colloidal ceria or colloidal titania. In some embodiments, the cationic abrasive can include cationic colloidal silica, or base immobilized non-ionic silica. In some embodiments, the anionic abrasive can include anionic colloidal silica, or acid immobilized non-ionic silica. In some embodiments, the silica can be prepared by a sol-gel reaction from tetramethyl orthosilicate. In some embodiments, the cationic abrasive can include terminal groups of formula (I):

$$-O_m-X-(CH_2)_n-Y \qquad (I),$$

in which m is an integer from 1 to 3; n is an integer from 1 to 10; X is Al, Si, Ti, or Zr; and Y is a cationic amino or thiol group. In some embodiments, the anionic abrasive can include terminal groups of formula (I):

$$-O_m-X-(CH_2)_n-Y \qquad (I),$$

in which m is an integer from 1 to 3; n is an integer from 1 to 10; X is Ce, Al, Si, Ti, or Zr; and Y is an acid group. In some embodiments, the cationic or anionic abrasive can be present in the composition in an amount of from about 0.01 wt % to about 50 wt % based on the total weight of the composition.

In some embodiments, the acid can be selected from the group consisting of formic acid, acetic acid, malonic acid, citric acid, propionic acid, malic acid, adipic acid, succinic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, amino acetic acid, peracetic acid, potassium acetate, phenoxyacetic acid, glycine, bicine, diglycolic acid, glyceric acid, tricine, alanine, histidine, valine, phenylalanine, proline, glutamine, aspartic acid, glutamic acid, arginine, lysine, tyrosine, benzoic acid, nitric acid, sulfuric acid, sulfurous acid, phosphoric acid, phosphonic acid, hydrochloric acid, periodic acid, and mixtures thereof. In some embodiments, the base can be selected from the group consisting of potassium hydroxide, sodium hydroxide, cesium hydroxide, ammonium hydroxide, triethanolamine, diethanolamine, monoethanolamine, tetrabutylammonium hydroxide, tetramethylammonium hydroxide, lithium hydroxide, imidazole, triazole, aminotriazole, tetrazole, benzotriazole, tolytriazole, pyrazole, isothiazole, and mixtures thereof. In some embodiments, the acid or base can be present in the composition in an amount of from about 0.0001 wt % to about 30 wt % based on the total weight of the composition.

In some embodiments, the cationic or anionic abrasive has a mean particle size of from about 1 nm to about 5000 nm.

In some embodiments, the polishing composition containing a cationic abrasive can have a zeta potential of from about 0 mV to about +100 mV. In some embodiments, the polishing composition containing an anionic abrasive can have a zeta potential of from about 0 mV to about −100 mV.

In some embodiments, the polishing composition can have a conductivity of from about 0.01 mS/cm to about 100 mS/cm.

In some embodiments, the zeta potential difference between the polishing composition containing a cationic abrasive and silicon oxide or polysilicon is greater than 20 mV and the zeta potential difference between the polishing composition containing a cationic abrasive and silicon nitride in less than 20 mV. In some embodiments, the zeta potential difference between the polishing composition containing an anionic abrasive and silicon nitride is at least about 20 mV and the zeta potential difference between the polishing composition containing an anionic abrasive and polysilicon is at most about 20 mV.

In some embodiments, the polishing method using a polishing composition containing a cationic abrasive removes substantially all of the at least one of silicon oxide and polysilicon on the substrate. In such embodiments, the polishing method can further include a step of removing at least some (e.g., substantially all) of silicon nitride on the substrate.

In some embodiments, the polishing method using a polishing composition containing an anionic abrasive removes substantially all of silicon nitride on the substrate. In such embodiments, the polishing method can further include a step of removing at least some (e.g., substantially all) of polysilicon on the substrate.

In some embodiments, the substrate can further include an additional material selected from the group consisting of metals, metal oxides, metal nitrides and dielectric materials. In some embodiments, the polishing method can further include producing a semiconductor device from the substrate treated by the polishing composition.

DETAILED DESCRIPTION OF THE DISCLOSURE

The present disclosure provides polishing compositions as well as methods of polishing substrates using the same. The polishing compositions generally comprise (a) a cationic or anionic abrasive, (b) an acid and/or base as a pH adjustor, and (c) water. The polishing compositions can have a pH of about 2 to about 7. The polishing compositions of the present disclosure can selectively and preferentially polish or remove dielectric (Silicon Nitride (SiN), Silicon Oxide (TEOS: tetra-ethyl ortho-silicate), Poly-silicon (P—Si), and low-k/ultra-low k (SiCOH) dielectric) films due to unique electrostatic charge interactions of the "charged" abrasive, and the charge on the surface of the solid dielectric films. This unique abrasive and dielectric film charge interaction based polishing composition (slurry) design to provide advantageous CMP material removal rates (RRs) is the subject of this invention disclosure. Such polishing compositions can also be used to polish materials/film stacks that include metals such as cobalt, copper, tungsten, tantalum, titanium, ruthenium, aluminum and their nitrides and oxides, in addition to the dielectric films described above.

The polishing compositions in the present disclosure generally include charged abrasives: either an anionic (negatively charged) abrasive or a cationic (positively charged) abrasive. In general, a polishing composition (e.g., a colloidal dispersion) containing a charged abrasive has an electrostatic charge as seen in zeta potential plots. The zeta potential, also sometimes known as the electrokinetic potential, describes the charging behavior at a solid-liquid interface. In other words, the interfacial charge distribution at a solid-liquid interface is called the zeta potential.

Figure 2:
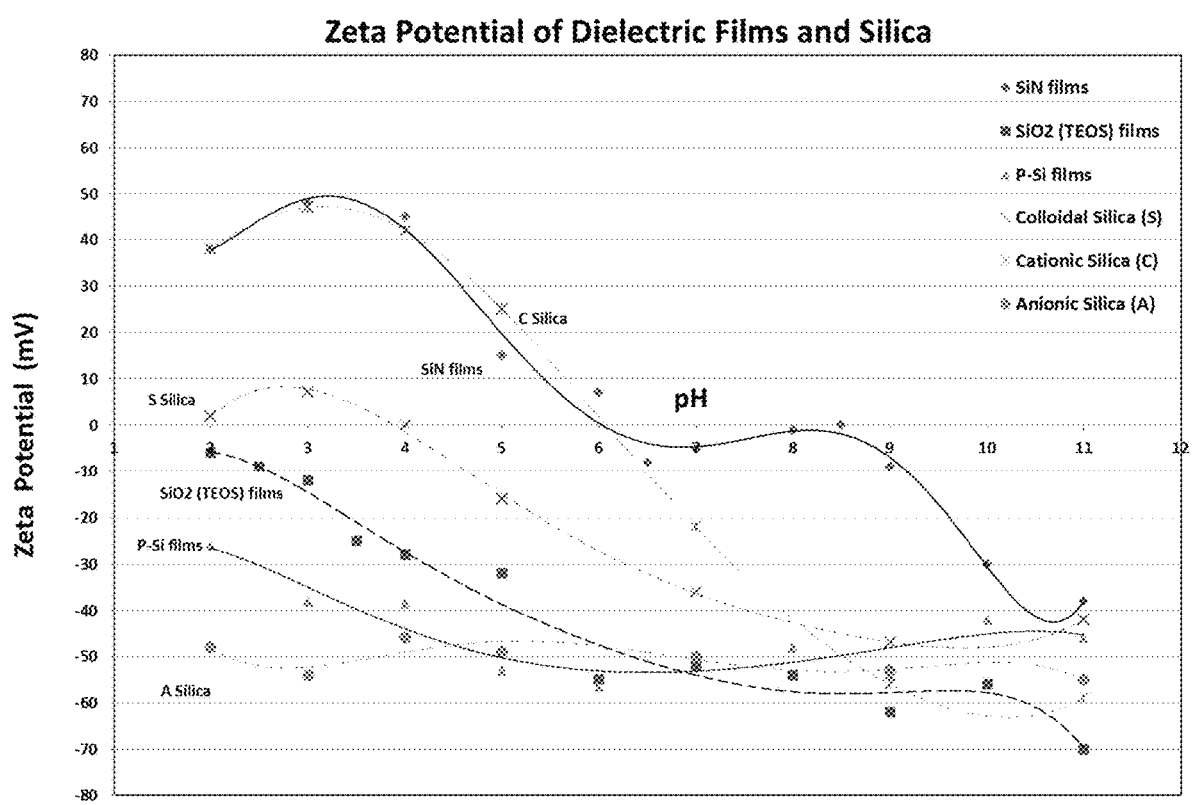
FIG. 2 shows the zeta potential of various dielectric films (SiN, $SiO_2$(TEOS), & P—Si) and silica types (normal/nonionic colloidal silica (S), Cationic silica (C), and Anionic silica (A)) in the pH range of 2-11. Further, FIG. 2 demonstrates that in the pH range of 2-7, as per the zeta potential, the C silica repels with SiN films, and attracts to $SiO_2$ (TEOS) and P—Si films, whereas the A silica attracts to SiN films and repels with $SiO_2$(TEOS) and P—Si films.

Anionic abrasives are colloidal abrasives that have been imparted with a negative charge and show negative potential values (in mV) in zeta potential plots, whereas cationic abrasives show positive zeta potential values (see FIG. 2; pH 2-6). Typically, non-ionic/conventional colloidal silica dispersions (colloidal silica (S) in FIG. 2) are somewhat unstable in the acidic pH regime due to their small zeta potentials.

In general, zeta potential is a good indicator of dispersion stability for abrasive dispersions as well as CMP polishing composition (slurry) dispersions containing those abrasives. In addition, thin films such as $SiO_2$ films, SiN films, and P—Si films also have zeta potentials (see FIG. 2). The zeta potential measures the potential difference between the dispersion medium and the stationary layer of fluid attached to the dispersed particle (sometimes also referred to as the potential difference in the interfacial double layer at the location of the slipping plane versus a point in the bulk fluid away from the interface). Zeta potential is expressed in mV, and measures the electrophoretic mobility of the particles. The zeta potential of dispersions (abrasive containing colloidal dispersions or polishing dispersions containing abrasives) can be measured by commercially available tools such as the AcoustoSizer II tool made by Colloidal Dynamics, or Malvern tool made by Malvern Instruments. Whereas the AcoustoSizer is based on acoustics technology, the Malvern tool is based on dynamic light scattering principles. Similarly, the zeta potential (ZP) of solid surfaces such as dielectric films or polishing pads can be measured using a SurPASS tool from Anton Paar. For example, the ZP of SiN, $SiO_2$ (TEOS) and P—Si dielectric films shown in FIG. 2 were measured using the SurPASS 3 tool from the vendor Anton Paar.

The zeta potential is particularly useful in determining colloidal dispersion stability as it is indicative of the electrostatic repulsive forces between particles. The greater the absolute value of the zeta potential for an electrostatically stabilized dispersion system, the greater the repulsion forces and the greater the stability of the colloidal dispersion. If the repulsion forces are small (smaller zeta potential values), particles tend to attract to each other and thus agglomerate/coagulate/lump, leading to dispersion instability. A general guideline, as per colloid chemistry principles would be as follows:

| Zeta Potential (mV) | Stability (with time) of Colloidal Dispersion |
|---|---|
| from 0 to ±10 | Immediate coagulation, gelling and settling |
| from ±10 to ±20 | Less stable |
| from ±20 to ±30 | Moderately stable |
| from ±30 to ±60 | Good stability |
| More than ±60 | Excellent stability |

Zeta potential is related to particle surface charge and the pH of the dispersion medium. Abrasives particles such as ceria, alumina, silica, titania, and zirconia have surface charge in their colloidal dispersion state. This surface charge changes with pH, and the indirect manifestation of this change in surface charge is the zeta potential value. As the zeta potential (ZP) changes with pH, there might be a particular pH value at which the ZP of the system is zero. This condition of zero zeta potential (at a particular pH) is referred to as the isoelectric point (IEP). A dispersion system at IEP is generally very unstable and the particles at the IEP pH may agglomerate, thereby increasing the particle size. Non-ionic colloidal silica is unstable in the acidic pH regime as it has 2 IEPs (at pH ~2 and pH ~4) in acidic conditions (see FIG. 2; Colloidal Silica (S)). Thus, it is technically very difficult to use non-ionic colloidal silica in polishing compositions (slurries) which have operating pH in the 2-5 range, since the abrasive in unstable (as ZP is 0 to ±10; see FIG. 2) and causes agglomeration/gelling and an increase in particle size of these CMP slurries. This increase in particle size of the CMP slurries is detrimental as it leads to scratches and defects on the wafers during polishing and causes inconsistent CMP material removal rates (RRs) across the wafer and dies, thus ultimately resulting in device failure. Therefore, it is desirable to have abrasives (such as silica) that are stable in the acidic pH regime so that CMP slurries containing those stable abrasives could be formulated. Furthermore, most FEOL slurries that are used to polish dielectrics operate in the acidic pH range, re-emphasizing the need to have colloidal stable abrasive dispersions in acidic pH. Thus, to increase the stability of abrasive particles, the surface of the abrasives can be modified with anionic or cationic groups to impart negative/positive charge on these abrasives, thereby increasing their absolute zeta potential values and making the same particles stable in the acidic pH regime. For example, some of the terminal silanol (Si—O—H) groups of non-ionic silica (FIG. 2; Colloidal Silica (S)) can be modified by terminal cationic groups to obtain cationic silica (C Silica) that has >+30 mV ZP in the 2-5 pH range, and is thus a stable colloidal dispersion (FIG. 2; Cationic silica (C)) in this pH range. Similar modification of non-ionic silica with anionic groups can lead to anionic silica (A silica) that has about −50 mV ZP in the entire 2-8 pH range (FIG. 2; Anionic silica (A)).

In this invention disclosure, the zeta potentials (ZPs) of the modified cationic/anionic silica and the ZPs of three prevalent dielectric films: SiN, $SiO_2$(TEOS) and P—Si have been carefully analyzed. The ZPs of all 6 of these materials (3 silica types and 3 film types) are shown in FIG. 2. Without wishing to be bound by theory, the present invention postulates that in the acidic pH range of 2-7, based on the ZP variations of these 6 materials, and the electrostatic repulsion/attraction forces between a charged abrasive and a film type, various selective FEOL dielectric CMP slurries can be formulated. In addition, CMP polishing data on dielectrics presented in Examples 1-3 below corroborate the hypothesis that polishing compositions can preferentially and selectively polish dielectric films based on the charges of abrasive particles and the charges of the films to be removed, on a semiconductor substrate. This disclosure exploits zeta potential variations (value, polarity) of abrasives and dielectric films (see FIG. 2), and takes advantage of electrostatic charge interactions to deliver desirable CMP polishing performance.

Charged abrasives, in the context of this disclosure, refer to abrasives that have been surface modified and thus possess either a positive charge (cationic abrasives) or a negative charge (anionic abrasives). For example, non-ionic colloidal silica can have some of its terminal silanol (Si—O—H) groups modified by a silane coupling agent. A silane coupling agent is typically of the formula:

$$(RO-)_3Si-(CH_2)_n\text{-anionic/cationic group;} \quad 1$$

where R is alkyl (such as methyl ($CH_3$) or ethyl ($CH_3CH_2$)); n is the number of $CH_2$ groups in the coupling agent (typically n has a value between 1 and 10); and anionic/cationic group refers to the end terminal group for the type of charged silica (anionic vs. cationic). This silane coupling agent can be reacted with non-ionic silica by a hydrolysis and condensation reaction to give charged/modified silica. This reaction is shown below:

$$Si-O-H/SiO_2+(RO-)_3Si-(CH_2)_n\text{-anionic/cationic group}\rightarrow\text{Charged Silica} \quad 2$$

The charged silica in reaction 2 contains silica ($SiO_2$), some remaining silanol groups (Si—OH), and some siloxane (—Si—O—Si—O—) bonding the silane coupling agent's cationic/anionic groups ((—O—)$_3$Si—($CH_2$)$_n$-anionic/cationic) to the silica. Once non-ionic silica is modified by these silane coupling agents, the zeta potential of the modified silica changes, and these "charged" dispersions now become stable in the acidic pH regime.

In some cases, to form anionic silica, a suitable silane coupling agent can be mercaptoalkyltrimethoxysilane (e.g., 3-mercaptopropyltrimethoxysilane). In such embodiments, after the silane coupling reaction shown above (see Reaction 2) is completed, the terminal —SH (thiol) group can be oxidized using hydrogen peroxide (or another oxidizer) to form terminal —$SO_3H$ groups on the modified anionic silica.

The zeta potentials of silica before (non-ionic silica (S)) and of after modification (cationic (C) & anionic (A) silica) are shown in FIG. 2. Negative zeta potential indicates that the particle surface is negatively charged (anionic) in the dispersion, and vice versa for cationic abrasive (positively charged). Non-ionic abrasives are modified into charged abrasives by attaching anionic/cationic groups to some of the abrasive particles. This modification to produce a charged abrasive by chemical bonding with a silane coupling agent is shown above. However, other methods such as physically forming self-assembled multiple monolayers on top of the silica particles, or physical adsorption of the anionic/cationic groups on the surface of silica particles can be employed to obtain charged abrasives. Furthermore, the "anionic silica" modified from "non-ionic silica" can also be done by introducing cationic species such as ammonium, sodium, potassium, or aluminum cations. This is especially true in the case of Water-Glass silica (inorganic silica made from sodium silicate (water glass) raw material) wherein the incorporation of aluminum (Al) into the surface of the particle leads to the formation of —Al—OH groups. This results in very highly negatively charged surfaces (anionic silica) in the 2-6 pH regimes. Conversely, for cationic sols from water-glass silica, the surface can be coated with Aluminum Oxide ($Al_2O_3$). This makes the charge on the surface of the silica positive (cationic silica), especially at acidic pH values below pH of 4.

The silica (cationic or anionic) used in the polishing compositions of this disclosure can be prepared from any one of the four most prevalent silica preparation methods used in the CMP industry: 1) organic silica obtained by a sol-gel reaction (including hydrolysis and condensation) of TetraMethyl OrthoSilicate (TMOS: Si($OCH_3$)$_4$) as a precursor/starting material, 2) organic silica obtained by a sol-gel reaction (including hydrolysis and condensation) of TetraEthyl OrthoSilicate (TEOS: Si($OCH_2CH_3$)$_4$) as a precursor/starting material, 3) inorganic silica obtained by dilution, ion-exchange, seed growth and concentration reaction of sodium silicate (e.g., Water-glass/sodium silicate: $Na_2SiO_3$) as a precursor/starting material, and 4) inorganic silica obtained by gas-phase combustion reaction of tetrachlorosilane ($SiCl_4$) as a precursor/starting material. Amongst the four silica preparation methods, the most preferred method for charged abrasives used in this disclosure is the organic silica obtained from TMOS (Method 1 above).

The charged abrasives (i.e., the cationic or anionic abrasive) can include oxides, such as alumina, silica, titania, ceria, zirconia, co-formed products thereof, or mixtures thereof. In some embodiments, the cationic or anionic abrasive can include colloidal oxides, such as colloidal alumina, colloidal silica, or colloidal titania.

In some embodiments, the cationic abrasive can include cationic colloidal silica, or base immobilized non-ionic silica (e.g., non-ionic silica physically or chemically modified to include basic groups). In some embodiments, the cationic abrasive can include terminal groups of formula (I):

$$-O_m-X-(CH_2)_n-Y \quad (I),$$

in which m is an integer from 1 to 3; n is an integer from 1 to 10; X is Ce, Al, Si, Ti, or Zr; and Y is a cationic amino or thiol group. In some embodiments, the cationic abrasive can include ceria having a mean particle size of at least about 1 nm (e.g., at least about 10 nm, at least about 100 nm, at least about 200 nm, at least about 300 nm, at least about 400 nm, or at least about 500 nm) to at most about 1000 nm (e.g., at most about 900 nm, at most about 800 nm, or at most about 700 nm).

In some embodiments, the anionic abrasive can include anionic colloidal silica, or acid immobilized non-ionic silica (e.g., non-ionic silica physically or chemically modified to include acidic groups). In some embodiments, the anionic abrasive can include terminal groups of formula (I):

$$-O_m-X-(CH_2)_n-Y \quad (I),$$

in which m is an integer from 1 to 3; n is an integer from 1 to 10; X is Ce, Al, Si, Ti, or Zr; and Y is an acid group.

The "anionic group" mentioned herein can be an acid such as sulfonic acid, phosphoric acid, or carboxylic acid, or an anionic salt of any of these acids. The "cationic group" is typically an amino group (—$NH_2$), a thiol (—SH) group, or a metal salt (such as a Na, K, or Al salt) or a cationic salt of any of these or related bases. For example, a silane coupling agent such as ($CH_3O$)$_3$Si($CH_2$)$_3$—$NH_2$ with a terminal —$NH_2$ group can be used to obtain cationic silica with a terminal —$NH_2$ base group, which is often referred to as base immobilized non-ionic silica. Commercially available charged abrasives are available from the following vendors—charged ceria from Solvay of Belgium, charged alumina from Evonik Industries of Germany, and charged silica from Fuso Chemical Co., Ltd. of Japan and Nalco Company of IL, USA. In the present disclosure, "charged abrasives" mean negatively- or positively-charged abrasives and include for example, the aforementioned commercially available charged abrasives from their respective vendors. They also include in-house abrasives chemically modified by anionic/cationic groups (such as acid immobilization), in-situ charge modified abrasives, abrasives physically modified by multiple monolayer formation or physical surface adsorption, or abrasives modified by any other suitable methods to impart the desired charge. These charged abrasives can be used in combination with one or more other chemicals to obtain polishing composition having various dielectric film removal rates.

In this invention, it is preferred that the charged abrasives and/or the polishing compositions containing those abrasives have a zeta potential in the range of about 0 mV to about ±100 mV (e.g., from about ±5 mV to about ±90 mV and from about ±10 mV to about ±80 mV). For example, the cationic abrasives and polishing compositions containing those abrasives can have zeta potential (e.g., a positive zeta potential) in the 0 to +100 mV range (e.g., from about 1 to about +100 mV, from about +5 mV to about +90 mV, from about +10 mV to about +80 mV, from about +20 mV to about +70 mV, or from about +30 mV to about +50 mV) in the 2-7 (e.g., 2-6) pH regime, whereas the anionic abrasives and polishing compositions containing those abrasives can have zeta potential (e.g., a negative zeta potential) in the 0 to −100 mV range (e.g., from about −1 to about −100 mV, from about −5 mV to about −90 mV, from about −10 mV to about −80 mV, from about −20 mV to about −70 mV, from about −30 mV to about −60 mV, or from about −40 mV to about −50 mV) in the 2-7 (e.g., 2-6) pH regime. This is illustrated in FIG. 2.

The charge of the polishing compositions described herein can also be measured by their electrical conductivity. For example, the polishing compositions can have a conductivity in the range of from about 0.01 to about 100 milli-Siemens per centimeter (mS/cm), or any subranges therebetween, from about 0.1 to about 10 mS/cm, or any subranges therebetween, or from about 0.5 to about 5 mS/cm, or any subranges therebetween.

The charged abrasive (cationic or anionic) may be present in a polishing composition in an amount from about 0.01 wt % to about 50 wt %, based on the total weight of the composition, or any subranges therebetween, or about from 0.05 wt % to about 40 wt %, based on the total weight of the composition, or any subranges therebetween. For example, the cationic or anionic abrasive can be present in an amount of at least about 0.01 wt % (e.g., at least about 0.1 wt %, at least about 0.5 wt %, at least about 1%, or at least about 5 wt %) to at most about 50 wt % (e.g., at most about 40 wt %, at most about 30 wt %, at most about 25 wt %, at most about 20 wt %, at most about 10 wt %, or at most about 5 wt %) based on the total weight of the polishing composition.

The polishing compositions of the present disclosure, in addition to charged abrasives, can contain a pH adjuster (e.g., an acid, a base, or both) to adjust the pH to the operating pH of the polishing composition. Suitable acids to adjust pH include (but are not limited to) carboxylic acids such as formic acid, acetic acid, malonic acid, citric acid, propionic acid, malic acid, adipic acid, succinic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene) triamine phosphonic acid, amino acetic acid, peracetic acid, potassium acetate, phenoxyacetic acid, glycine, bicine, diglycolic acid, glyceric acid, tricine, alanine, histidine, valine, phenylalanine, proline, glutamine, aspartic acid, glutamic acid, arginine, lysine, tyrosine, or benzoic acid, and inorganic acids such as nitric acid, sulfuric acid, sulfurous acid, phosphoric acid, phosphonic acid, hydrochloric acid, periodic acid or any combinations thereof. Suitable bases to adjust pH include (but are not limited to) potassium hydroxide, sodium hydroxide, cesium hydroxide, ammonium hydroxide, triethanol amine, diethanol amine, monoethanol amine, tetrabutyl ammonium hydroxide, tetramethyl ammonium hydroxide, lithium hydroxide, and any azole containing bases such as imidazole, triazole, aminotriazole, tetrazole, benzotriazole, tolytriazole, pyrazole or isothiazole, and any combinations thereof.

In some embodiments, the pH adjustor (e.g., an acid, a base, or both) can be present in an amount of from at least about 0.0001 wt % (e.g., at least about 0.001 wt %, at least about 0.01 wt %, at least about 0.1 wt %, at least about 0.5 wt %, at least about 1 wt %, at least about 5 wt %, or at least about 10 wt %) to at most about 30 wt % (e.g., at most about 25 wt %, at most about 20 wt %, at most about 15 wt %, at most about 10 wt %, at most about 5 wt %, or at most about 1 wt %) based on the total weight of a polishing composition described herein.

In some embodiments, the polishing compositions described herein can include a liquid medium, such as water. In some embodiments, the water can be in an amount of from at least about 20 wt % (e.g., at least about 30 wt %, at least about 40 wt %, at least about 50 wt %, at least about 60 wt %, at least about 70 wt %, at least about 80 wt %, at least about 90 wt %, or at least about 95 wt %) to at most about 99 wt % (e.g., at most about 98 wt %, at most about 97 wt %, at most about 96 wt %, or at most about 95 wt %) of a polishing composition described herein.

In some embodiments, the polishing compositions containing cationic or anionic abrasives described herein can be substantially free of one or more of certain ingredients, such as halide salts, polymers (e.g., cationic or anionic polymers), surfactants, plasticizers, oxidizing agents, corrosion inhibitors (e.g., azole or non-azole corrosion inhibitors), and/or non-ionic abrasives. The halide salts that can be excluded from the polishing compositions include alkali metal halides (e.g., sodium halides or potassium halides) or ammonium halides (e.g., ammonium chloride), and can be chlorides, bromides, or iodides. As used herein, an ingredient that is "substantially free" from a polishing composition refers to an ingredient that is not intentionally added into the polishing composition. In some embodiments, the polishing compositions described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing compositions. In some embodiments, the polishing compositions described can be completely free of one or more the above ingredients.

The pH of the composition of the present disclosure can be from about 2 to about 7, or any subranges therebetween. The pH can also be from about 3 to about 6, or any subranges therebetween, or from about 3.4 to about 5.75, or any subranges therebetween. For example, the pH can be from at least about 2 (e.g., at least about 2.5, at least about 3, at least about 3.5, at least about 4, at least about 4.5, or at least about 5) to at most about 7 (e.g., at most about 6.5, at most about 6, at most about 5.5, at most about 5, at most about 4.5, or at most about 4). The pH can be measured using a pH meter, such as those available from the company Thermo Fisher Scientific.

In some embodiments, the charged (cationic or anionic) abrasives described herein can have a mean particle size of from about 1 nm to 5000 nm (e.g., from about 1 nm to 1000 nm, from about 1 nm to 500 nm, and about 1 nm to 150 nm), or any subranges thereof. For example, the charged abrasives can have a mean particle size of from at least about 1 nm (e.g., at least about 5 nm, at least about 10 nm, at least about 50 nm, at least about 100 nm, at least about 200 nm, at least about 300 nm, at least about 400 nm, or at least about 500 nm) to at most about 5000 nm (e.g., at most about 2500 nm, at most about 1000 nm, at most about 750 nm, at most about 500 nm, at most about 250 nm, or at most about 100 nm). Without wishing to be bound by theory, it is believed that anionic abrasives having a smaller particle size have the advantage of preferentially giving lower (TEOS) RRs, and thus improving the overall selectivity to $SiO_2$ in systems where lower TEOS rates are needed (anionic silica systems). Conversely, it is believed that cationic abrasives having a larger particle size have the advantage of preferentially giving higher $SiO_2$ (TEOS) RRs, and thus improving the overall selectivity to $SiO_2$ in systems where higher $SiO_2$ rates are needed (cationic silica systems). Further, it is believed that, for anionic silica systems where high SiN film rates are needed, a smaller particle size gives higher SiN removal rates because smaller particles have a higher overall surface area and thus increase SiN film removal rates as the active binding sites on the silica increases with the surface area increase. As used herein, "particle size" used in this disclosure is the mean particle size (MPS) determined by dynamic light scattering techniques. For instance, the MPS can be measured by using a commercial dynamic light scattering tool from Malvern Instruments Ltd.

In the discussion above and in the following examples, the compositions of the present disclosure are discussed in combination with polishing the most prevalent dielectric films, i.e., SiN films, $SiO_2$ (TEOS) films, and P—Si films. However, present compositions can also be used to polish silicon carbide (SiC), silicon carbide nitride ($SiC_xN_y$), silicon carbide oxide ($SiC_xO_y$), spin-on-carbon (C), Carbon only (C), and silicon carbide hydride ($SiC_xH_y$). Furthermore, the dielectric materials polished can be low-k dielectric ($SiC_xO_yH_z$), and ultra-low k (ULK) dielectric ($SiC_xO_yH_z$) materials. Some common examples of low-k and ULK dielectric materials are Black Diamond I and II, respectively, from Applied Materials.

In some embodiments, the CMP polishing compositions or slurries described herein can be used to polish patterned wafers that contain a heterogeneous combination of metal and dielectric films at various densities and thickness levels. An end goal of CMP compositions is to flatten and planarize all the peaks and valleys on a patterned wafer. Thus, the polishing compositions of the present disclosure, when used to polish dielectric films, can also polish metal, metal oxide, or metal nitride films on patterned wafers. Common examples of metals that can be polished include copper, ruthenium, cobalt, aluminum, tantalum, titanium, and tungsten. Similarly, common examples of metal oxides that can be polished include hafnium oxide, titanium oxide, zirconium oxide, tantalum oxide, aluminum oxide, tungsten oxide, and yttrium oxide. Common examples of metal nitrides that can be polished include tantalum nitride, titanium nitride, tungsten nitride and cobalt nitride. Thus, the polishing compositions of the present disclosure can at any time during polishing of patterned wafers polish a multitude of dielectric and metal/metal oxide/metal nitride films as per the integration requirements.

In general, this disclosure also features methods of using one or more of the polishing compositions described herein.

In some embodiments, this disclosure features a polishing method using a polishing composition containing a cationic abrasive. In such embodiments, the method can include (a) applying a polishing composition to a substrate having silicon nitride and at least one of silicon oxide and polysilicon on a surface of the substrate, in which the composition includes a cationic abrasive, an acid or base, and water, and the composition has a pH of about 2 to about 7; and (b) brining a pad into contact with the substrate and moving the pad in relation to the substrate. The substrate can be a semiconductor substrate, such as a patterned wafer. In such embodiments, the method can remove at least a portion of at least one of silicon oxide and polysilicon at a first rate, the method can remove at least a portion of silicon nitride at a second rate, and a ratio of the first rate to the second rate is at least about 2:1. In some embodiments, the ratio of the first rate to the second rate can be at least about 3:1 (e.g., at least about 4:1, at least about 5:1, at least about 6:1, at least about 7:1, at least about 8:1, at least about 9:1, at least about 10:1; at least about 15:1, at least about 20:1, or at least about 50:1) or at most about 200:1 (or at most about 100:1).

In some embodiments, the zeta potential difference between the polishing composition containing a cationic abrasive and silicon oxide or polysilicon is at least about 20 mV (e.g., at least about 30 mV, at least about 40 mV, at least about 50 mV, at least about 60 mV, at least about 70 mV, at least about 80 mV, at least about 90 mV, or at least about 100 mV) and at most about 200 mV (e.g., at most about 150 mV). In some embodiments, the zeta potential difference between the polishing composition containing a cationic abrasive and silicon nitride is at most about 20 mV (e.g., at most about 15 mV, at most about 10 mV, at most about 5 mV, or at most about 1 mV) or about 0 mV. Without wishing to be bound by theory, it is believed that, when a polishing composition containing a cationic abrasive has a relatively large zeta potential difference relative to silicon oxide or polysilicon and a relatively small zeta potential difference relative to silicon nitride, the polishing composition can selectively remove silicon oxide or polysilicon without removing silicon nitride in any substantial amount (i.e., stop on SiN).

In some embodiments, the polishing method that uses a polishing composition containing a cationic abrasive can remove substantially all of silicon oxide and/or substantially all of polysilicon on the substrate. In some embodiments, such a polishing method can further include a step of removing at least some (e.g., substantially all) of silicon nitride on the substrate (e.g., by using a polishing composition containing an anionic abrasive).

In some embodiments, this disclosure features a polishing method using a polishing composition containing an anionic abrasive. In such embodiments, the method can include (a) applying a polishing composition to a substrate having silicon nitride and polysilicon on a surface of the substrate, in which the composition includes an anionic abrasive, an acid or base, and water, and the composition has a pH of about 2 to about 7; and (b) brining a pad into contact with the substrate and moving the pad in relation to the substrate. The substrate can be a semiconductor substrate, such as a patterned wafer. In such embodiments, the method can remove at least a portion of silicon nitride at a first rate, the method removes at least a portion of polysilicon at a second rate, and a ratio of the first rate to the second rate is at least about 2:1. In some embodiments, the ratio of the first rate to the second rate can be at least about 3:1 (e.g., at least about 4:1, at least about 5:1, at least about 6:1, at least about 7:1, at least about 8:1, at least about 9:1, at least about 10:1; at least about 15:1, at least about 20:1, or at least about 50:1) or at most about 200:1 (or at most about 100:1).

In some embodiments, the zeta potential difference between the polishing composition containing an anionic abrasive and silicon nitride is at least about 20 mV (e.g., at least about 30 mV, at least about 40 mV, at least about 50 mV, at least about 60 mV, at least about 70 mV, at least about 80 mV, at least about 90 mV, or at least about 100 mV) and at most about 200 mV (e.g., at most about 150 mV). In some embodiments, the zeta potential difference between the polishing composition containing an anionic abrasive and polysilicon in at most about 20 mV (e.g., at most about 15 mV, at most about 10 mV, at most about 5 mV, or at most about 1 mV) or about 0 mV. Without wishing to be bound by theory, it is believed that, when a polishing composition containing an anionic abrasive has a relatively large zeta potential difference relative to silicon nitride and a relatively small zeta potential difference relative to polysilicon, the polishing composition can selectively remove silicon nitride without removing polysilicon in any substantial amount (i.e., stop on polysilicon).

In some embodiments, the polishing method that uses a polishing composition containing an anionic abrasive can remove substantially all of silicon nitride on the substrate. In some embodiments, such a polishing method can further include a step of removing at least some (e.g., substantially all) of polysilicon on the substrate (e.g., by using a polishing composition containing a cationic abrasive).

In some embodiments, the polishing method that uses a polishing composition containing a cationic abrasive or an anionic abrasive can further include producing a semiconductor device from the substrate treated by a polishing composition described herein through one or more additional steps.

The contents of all publications cited herein (e.g., patents, patent application publications, and articles) are hereby incorporated by reference in their entirety.

EXAMPLES

Examples are provided to further illustrate the capabilities of the polishing compositions and methods of the present disclosure. The provided examples are not intended and should not be construed to limit the scope of the present disclosure.

Overview of Examples and Figures

Figure 1:
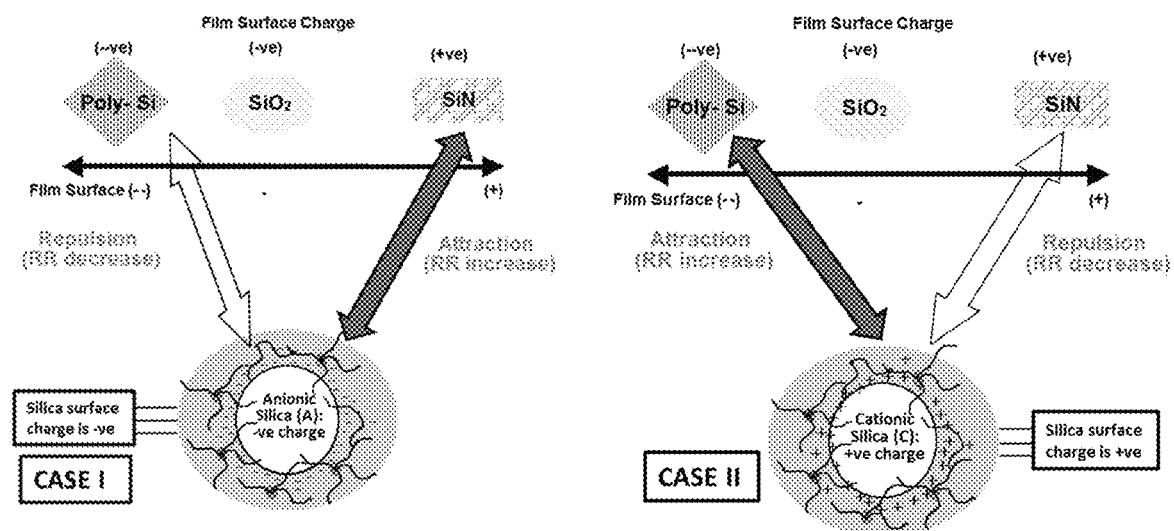
FIG. 1 provides an overview of the abrasive charge based design concept for selectively polishing various dielectrics. Case I (left) details an example where anionic abrasives are used to polish SiN selectively and stop on TEOS ($SiO_2$ films)/low-k/P—Si dielectric films. Case II (right) depicts an example wherein cationic abrasives are used to selectively polish TEOS ($SiO_2$ films)/low-k/P—Si dielectric films and stop on SiN films. The table at the bottom of FIG. 1 summarizes the type of charged abrasives (anionic/cationic) suitable for the type of polishing composition design and application.
Figure 3:
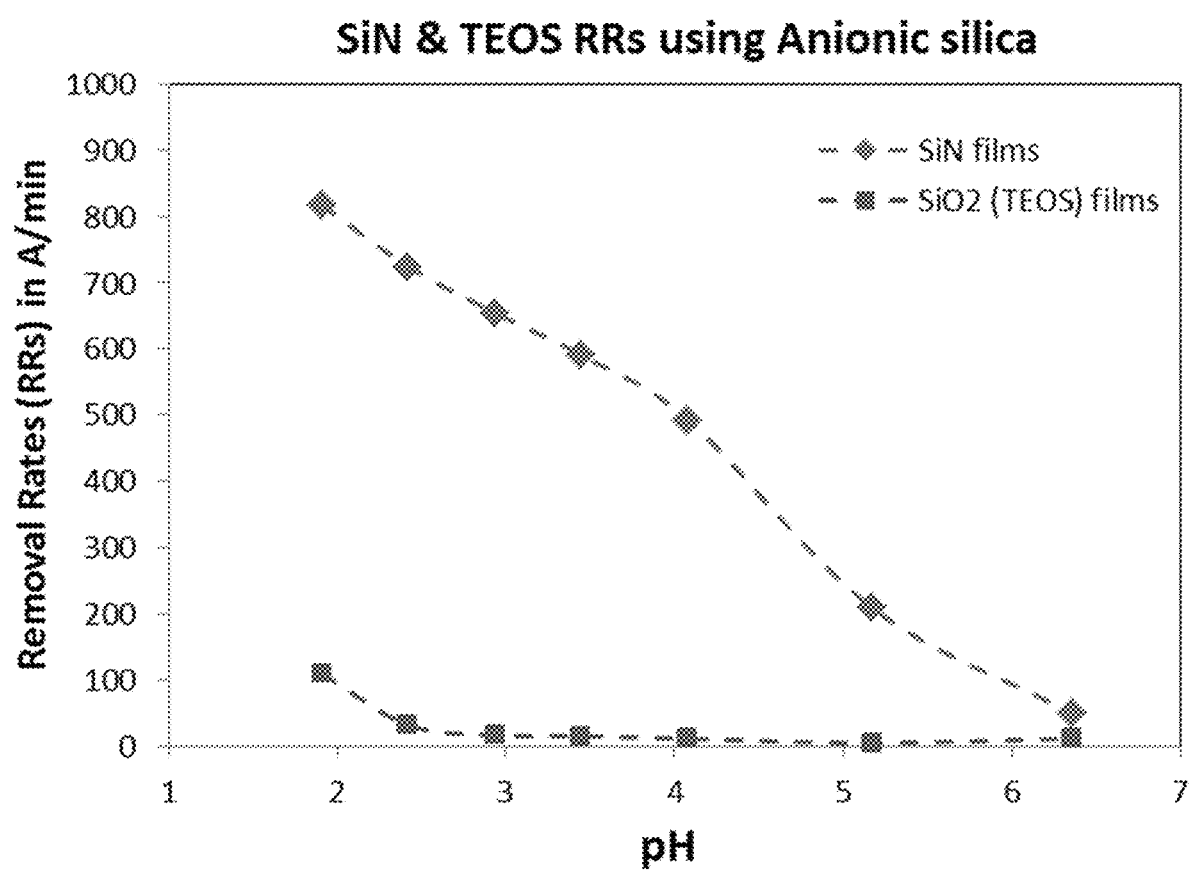
FIG. 3 shows the charge based design concept using anionic abrasives based on the data obtained in Example 1 (Case I shown in FIG. 1). Based on FIG. 3, it is believed that when anionic abrasives are used in CMP slurry formulations, the negative charge on the abrasives attracts to the positive charge on SiN films (see zeta potentials) and gives high CMP removal rates (RRs) of SiN films. Conversely, it is believed that $SiO_2$ (TEOS) films have negative charge (like anionic abrasives) and repel the abrasives, thus causing the CMP formulations containing anionic abrasives to stop on, or exhibit very low CMP RRs on, $SiO_2$ (TEOS) films.

FIGS. 1 and 2 illustrate the overall concept of using charged abrasive for selective polishing of dielectrics. FIG. 3 (Example 1: Anionic silica for High SiN/SiO$_2$ selectivity), FIG. 4 (Example 2: Anionic silica for High SiN/P—Si selectivity), and FIG. 5 (Example 3: Cationic silica for High SiO$_2$/SiN selectivity) show that actual experimental results are consistent with the above concept.

Figure 4:
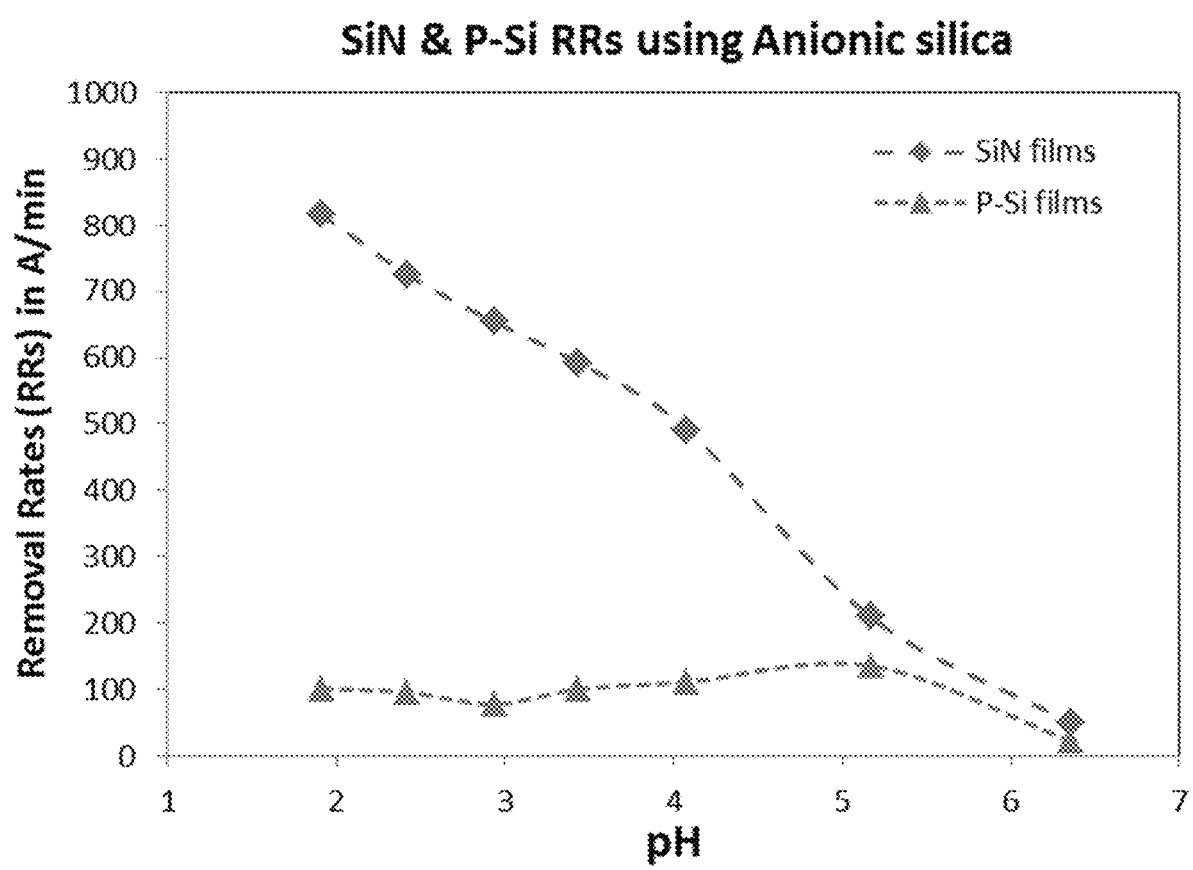
FIG. 4 shows another scenario of Case I based on the data obtained in Example 2. Based on FIG. 4, it is believed that using anionic abrasives results in high CMP removal rates (RRs) on SiN films due to attraction forces between dissimilar charges. Conversely, it is believed that, since anionic abrasives and P—Si films have similar negative charge, they repel each other and, thus, polishing compositions containing anionic abrasives give very low CMP RRs on P—Si films (or stop on P—Si films).

FIG. 1 shows that, in Case I, when anionic silica is used, the surface charge of the silica and consequently the slurry is negative. FIG. 1 also shows the surface charge of the three tested dielectric films (i.e., SiN, SiO$_2$, and P—Si films). As can be seen in Case I, SiN films include positive charges and SiO$_2$ films include negative charges. The P—Si films include much more negative charges than the SiO$_2$ films. In other words, SiN, SiO$_2$, and P—Si films follow the following negative charge scale, P—Si>>SiO$_2$>>SiN. This electrostatic charge of the films is also depicted further in FIG. 2 as zeta potential versus pH values. Thus, for Case I, based on electrostatic forces of attraction and/or repulsion (attraction means silica and a film attract and thus give high removal rates (RRs); conversely, repulsion means that silica and a film repel and thus give low RRs for that film), it is hypothesized that anionic silica (A) will give high SiN RRs and give low RRs on SiO$_2$ and P—Si films. Experimental confirmation of this hypothesis is seen in FIGS. 3 and 4.

Figure 5:
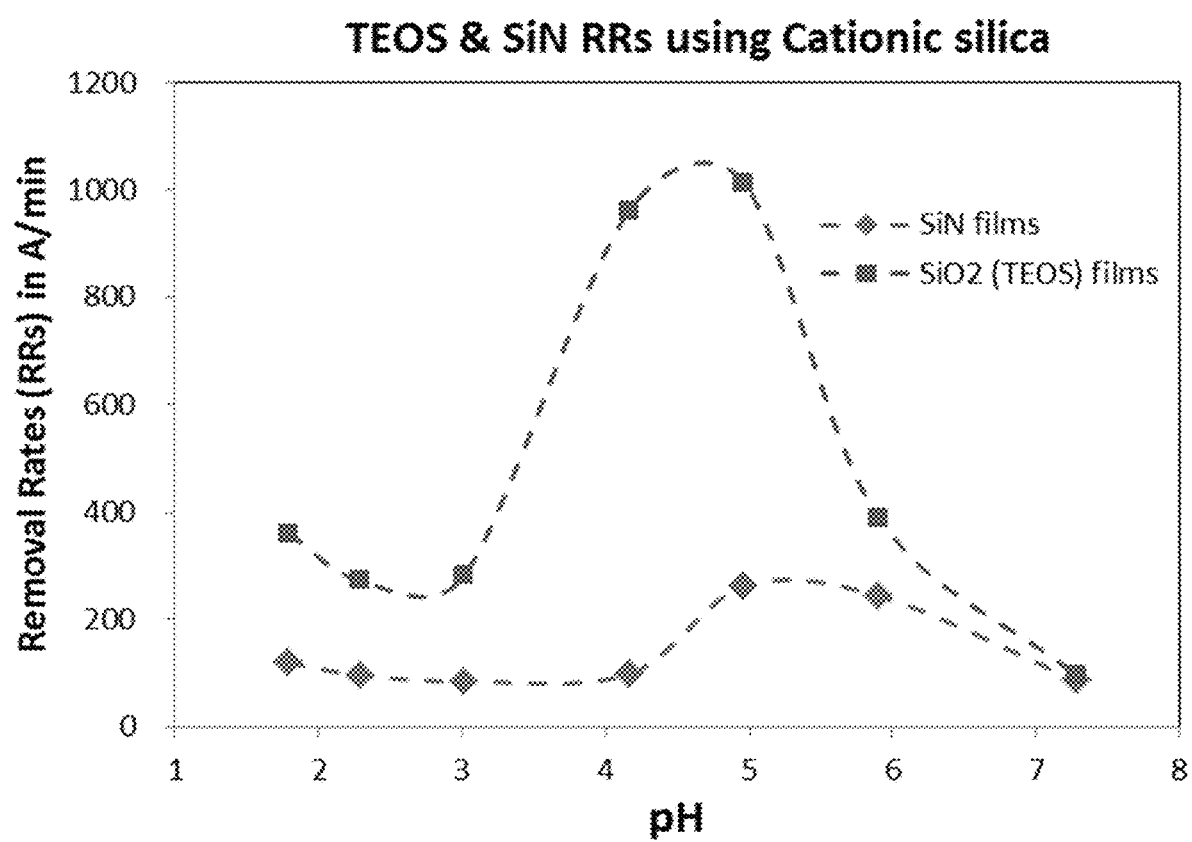
FIG. 5 shows one scenario of the charge based design concept using cationic abrasives based on the data obtained in Example 3 (Case II shown in FIG. 1). It is believed, when cationic abrasives are used in CMP slurry formulations in acidic pH regime, the positive charge on the abrasives attracts to the negative charge on $SiO_2$ (TEOS) films (see zeta potentials) and gives high CMP removal rates (RRs) of $SiO_2$ (TEOS) films. Conversely, it is believed that SiN films have positive charge (like cationic abrasives) and repel the cationic abrasives, thus causing the CMP formulations containing cationic abrasives to stop on, or exhibit very low CMP RRs on, SiN films.

Conversely, for Case II, an example of cationic silica (C) is shown, wherein the silica, and consequently the CMP slurry containing such silica, has positive surface charge/zeta potential. FIG. 2 gives the zeta potential/surface charge of the cationic silica and the SiN, SiO$_2$ and P—Si films in the pH range of 2-11. In Case II shown in FIG. 1, it is hypothesized that cationic silica (C) will give high RRs on SiO$_2$ and/or P—Si films, and will give low RRs on SiN films. Experimental confirmation of this hypothesis is seen in FIG. 5.

Example 1: Anionic Silica for High SiN/SiO2 Selectivity

This example demonstrates the use of anionic silica (negatively charged silica) in CMP slurry compositions that resulted in high SiN removal rates (RRs) and low SiO$_2$ removal rates.

In this example, the polishing compositions or slurries included 1 wt % anionic silica abrasive, an acid and a base as pH adjustors, and water as a liquid carrier. The anionic silica abrasive was purchased from Fuso Chemical Co., Ltd. of Japan. The CMP slurries containing the anionic abrasive were pH adjusted with the pH adjustors to obtain slurries at pH interims of ~0.5 pH value in the ~2-6.5 acidic pH range. For all tested formulations, an Applied Materials Mirra CMP polisher was used with a downforce of 2 psi and a flow rate of 175 mL/min to polish 8 inch silicon nitride and silicon oxide blanket wafers. The polishing results expressed as removal rates for SiN and SiO$_2$ films are summarized in Table 1.

TABLE 1

Anionic abrasive containing slurry's RRs and selectivities on SiN and SiO$_2$ films. Graphical representation of the data is in FIG. 3.

| Slurry~pH | SiN RR (A/min) | SiO$_2$ RR (A/min) | SiN/SiO$_2$ selectivity ratio |
|---|---|---|---|
| 2 | 817 | 109 | 7 |
| 2.5 | 725 | 32 | 23 |
| 3 | 654 | 16 | 41 |
| 3.5 | 591 | 15 | 39 |
| 4 | 491 | 11 | 45 |
| 5 | 209 | 5 | 42 |
| 6 | 49 | 12 | 4 |

The zeta potentials (ZPs) of anionic silica were measured by using AcoustoSizer II made by Colloidal Dynamics, and the ZPs of SiN films and TEOS films were measured by SurPASS 3 made by Anton Paar. The results are summarized in Table 2. Table 2 also details the charge separation (absolute value of ZP difference) between the SiN films and anionic silica and between the SiO$_2$ films and anionic silica.

TABLE 2

Zeta potential and Charge separation values (mV) of anionic silica and SiN and TEOS films. Graphical representation of the data is in FIG. 2.

| Approximate pH | Zeta Potential Values (mV) of various films and charged silica | | | Charge separation/Absolute value (mV) of Zeta difference between film & silica | |
|---|---|---|---|---|---|
| | SiN films | SiO$_2$ films | Anionic silica | SiN films (+ve) & anionic silica (−ve) | SiO$_2$ films (−ve) & anionic silica (−ve) |
| 2 | 38 | −6 | −48 | 86 | 42 |
| 3 | 48 | −12 | −54 | 102 | 42 |
| 4 | 45 | −28 | −46 | 91 | 18 |
| 5 | 15 | −32 | −49 | 64 | 17 |
| 6 | 7 | −55 | −50 | 57 | 5 |

As shown in Table 2, when the pH values of the CMP compositions are from 2 to 6, the SiN films are positively charged (i.e., its ZPs are positive), whereas the anionic silica is negatively charged (i.e., its ZPs are negative). As a result, there are attraction forces between SiN and anionic silica, which is believed to result in high RRs for SiN films, as can be seen in Table 1 and FIG. 3. Conversely, both the SiO$_2$ films and the anionic silica are negatively charged (i.e., their ZPs are negative). As a result, there are repulsion forces between SiO$_2$ and anionic silica, which is believed to result in low RRs for SiO$_2$ films, as can be seen in Table 1 and FIG. 3. Indeed, as shown in Table 1, the CMP compositions containing anionic silica abrasive exhibited high SiN removal rates, low SiO$_2$ removal rates, and relatively high SiN/SiO$_2$ removal selectivity (i.e., preferentially removing SiN over SiO$_2$).

In particular, Table 2 shows that, when pH ranges from 2 to 4, the charge separation is the greatest between SiN films and anionic silica. In this pH range, the SiN RRs are the highest (between 817 A/min and 491 A/min; see Table 1) indicating that, due to greater charge separation, there are stronger forces of attraction between positively charged SiN films and negatively charged anionic silica, thereby leading to higher RRs for SiN films. Conversely, Table 2 shows that, when pH ranges from 4 to 6, the charge separation is the least between SiO$_2$ films and anionic silica (both of which are negatively charged). In this pH range, SiO$_2$ films and anionic silica repel each other the most and thus provide the lowest SiO$_2$ films RRs (between 5 A/min and 12 A/min; see Table 1).

The CMP slurry compositions discussed in Example 1 could be used in integrations where, on patterned wafers, a high selectivity ratio between SiN and SiO$_2$ films is desired. In the industry, these are typically referred to as Reverse-STI (Shallow Trench Isolation) selectivity schemes where it is desirable to remove SiN films at high RRs and minimize removal of SiO$_2$ films at very low to zero RRs.

Example 2: Anionic Silica for High SiN/P—Si Selectivity

This example demonstrates the use of anionic silica (negatively charged silica) in CMP slurry compositions that resulted in high SiN removal rRates and low P—Si (polysilicon) removal rates.

In this example, the polishing composition included 1 wt % anionic silica abrasive, an acid and a base as pH adjustors, and water as a liquid carrier. The anionic silica abrasive was purchased from Fuso Chemical Co., Ltd. of Japan. The CMP slurries containing the anionic abrasive were pH adjusted with the pH adjustors to obtain slurries at pH interims of ~0.5 pH value in the ~2-6.5 acidic pH range. For all tested formulations, an Applied Materials Mirra CMP polisher was used with a downforce of 2 psi and a flow rate of 175 mL/min to polish 8 inch silicon nitride and P—Si blanket wafers. The polishing results expressed as removal rates for SiN and P—Si films are summarized in Table 3.

TABLE 3

Anionic abrasive containing slurry's RRs and selectivities on SiN and P—Si films. Graphical representation of the data is in FIG. 4.

| Slurry~pH | SiN RR (A/min) | P—Si RR (A/min) | SiN/P—Si selectivity ratio |
|---|---|---|---|
| 2 | 817 | 101 | 8 |
| 2.5 | 725 | 95 | 7 |
| 3 | 654 | 78 | 8 |
| 3.5 | 591 | 100 | 6 |
| 4 | 491 | 111 | 4 |
| 5 | 209 | 135 | 2 |
| 6 | 49 | 22 | 2 |

The zeta potentials (ZPs) of anionic silica were measured by using AcoustoSizer II made by Colloidal Dynamics, and the ZPs of SiN films and P—Si films were measured by SurPASS 3 made by Anton Paar. The results are summarized in Table 4. Table 4 also details the charge separation (absolute value of ZP difference) between the SiN films and anionic silica and between the P—Si films and anionic silica.

TABLE 4

Zeta potential and charge separation values (mV) of anionic silica and SiN and P—Si films. Graphical representation of the data is in FIG. 2.

| | Zeta Potential Values (mV) of various films and "charged" silica | | | Charge separation/Absolute value (mV) of Zeta difference between film & silica | |
|---|---|---|---|---|---|
| Approximate pH | SiN films | P—Si films | Anionic silica | SiN films (+ve) & anionic silica (-ve) | P—Si films (-ve) & anionic silica (-ve) |
| 2 | 38 | -26 | -48 | 86 | 22 |
| 3 | 48 | -38 | -54 | 102 | 16 |
| 4 | 45 | -39 | -46 | 91 | 7 |
| 5 | 15 | -53 | -49 | 64 | 4 |
| 6 | 7 | -57 | -50 | 57 | 7 |

As shown in Table 3, when the pH values of the CMP compositions range from 2 to 7, the SiN films are positively charged, whereas the anionic silica is negatively charged. As a result, there are attraction forces between SiN films and anionic silica, which is believed to result in high RRs for SiN films, as can be seen in Table 3 and FIG. 4. Conversely, both the P—Si films and the anionic silica are negatively charged (i.e., their ZPs are negative). As a result, there are repulsion forces between the P—Si films and the anionic silica, which is believed to result in low RRs for P—Si films, as can be seen in Table 3 and FIG. 4. Indeed, as shown in Table 3, the CMP compositions containing anionic silica abrasive exhibited high SiN removal rates, low P—Si removal rates, and relatively high SiN/P—Si removal selectivity (i.e., preferentially removing SiN over P—Si).

The SiN/P—Si selectivity (i.e., from 2-8) is somewhat less than the SiN/SiO$_2$ selectivity (i.e., from 4 to 45). This lower SiN/P—Si selectivity can be attributed to the slightly higher P—Si RRs (when compared to SiO$_2$ RRs) in the 3-5 pH range. It is believed that the surface chemistry of TEOS films is slightly different from the surface chemistry of P—Si films. The SiO$_2$ films include terminal silanol groups (Si—OH) on their surfaces, whereas the P—Si films include terminal hydride groups (Si—H) on their surfaces. Thus, it is believed that the repulsion forces are more pronounced between SiO$_2$ films and the anionic silica in the polishing compositions because the anionic silica also has silanol (Si—OH) surface groups. Therefore, it is believed that the negative charge on the silanol group in the anionic silica repels the negative charge on the surface silanol groups (Si—OH) of the SiO$_2$ films, thereby generating relatively strong forces of repulsion and consequently reducing the SiO$_2$ RRs. Conversely, the hydrogen from the hydride groups (Si—H) on the P—Si films is not negatively charged and thus does not repel the anionic silica as strongly as the SiO$_2$ films, thereby giving higher P—Si film RRs when compared to the TEOS films. As a result, it is believed that the SiN/P—Si selectivity is lower than the SiN/SiO$_2$ selectivity when using anionic silica containing CMP compositions to polish these films, which has been confirmed by the experiments described above.

On the other hand, the general concept of charged abrasive containing CMP composition design for specific dielectric film rate selectivities is still applicable. As shown above, SiN films having a positive ZP display very high RRs due to attraction forces with anionic silica and P—Si films having a negative ZP exhibit low RRs due to repulsion forces with anionic silica. Thus, an anionic abrasive containing CMP composition could be used for semiconductor integration schemes where high SiN and low P—Si removal rates are required. Many integrations in FEOL chip assembly require such selectivities on patterned wafers that have additional conductors and/or insulators such as metals, metal oxides, metal nitrides, and dielectric films. The selectivity of SiN/P—Si of 2-8 with the anionic abrasive containing CMP composition, although not as high as the SiN/SiO$_2$ selectivity, is still very attractive for use in polishing patterned wafers containing SiN and P—Si films, where the goal is to remove the SiN films and stop on the P—Si films.

Example 3: Cationic Silica Abrasive for High SiO$_2$/SiN Selectivity

This example demonstrates the use of cationic silica (positively charged silica) in CMP slurry compositions that resulted in high SiO$_2$ removal rates and low SiN removal rates.

In this example, the polishing composition included 1 wt % cationic silica abrasive, an acid and a base as pH adjustors, and water as a liquid carrier. The cationic silica abrasive was purchased from Fuso Chemical Co., Ltd. of Japan. The CMP slurries containing the cationic abrasive were pH adjusted with the pH adjustors to obtain slurries at pH interims of ~0.5 pH value in the ~2-7 pH range. For all tested formulations, an Applied Materials Mirra CMP polisher was used with a downforce of 2 psi and a flow rate of 175 mL/min to polish 8 inch silicon nitride and silicon oxide blanket wafers. The polishing results expressed as removal rates for SiO$_2$ and SiN films are summarized in Table 5.

TABLE 5

Cationic abrasive containing slurry's RRs and selectivities on SiO$_2$ and SiN films. Graphical representation of the data is in FIG. 5.

| Slurry~pH | SiO$_2$ RR (A/min) | SiN RR (A/min) | SiO$_2$/SiN selectivity ratio |
|---|---|---|---|
| 2 | 361 | 120 | 3 |
| 2.5 | 274 | 97 | 3 |
| 3 | 281 | 85 | 3 |
| 4 | 962 | 98 | 10 |
| 5 | 1015 | 261 | 4 |
| 6 | 392 | 244 | 2 |
| 7 | 95 | 86 | 1 |

The zeta potentials (ZPs) of cationic silica were measured by using AcoustoSizer II made by Colloidal Dynamics, and the ZPs of SiN films and SiO$_2$ films were measured by SurPASS 3 made by Anton Paar. The results are summarized in Table 6. Table 6 also details the charge separation (absolute value of ZP difference) between the SiO₂ films and cationic silica and between the SiN films and cationic silica.

TABLE 6

Zeta potential and charge separation values (mV) of cationic silica and TEOS and SiN films. Graphical representation of the data is in FIG. 2.

| | Zeta Potential Values (mV) of | | | Charge separation/Absolute value (mV) of Zeta difference between film & silica | |
|---|---|---|---|---|---|
| | various films and "charged" silica | | | SiO₂ films (−ve) | SiN films (+ve) |
| Approximate pH | SiN films | SiO₂ films | Cationic Silica | & cationic silica (+ve) | & cationic silica (+ve) |
| 2 | 38 | −6 | 38 | 44 | 0 |
| 3 | 48 | −12 | 47 | 59 | 1 |
| 4 | 45 | −28 | 42 | 70 | 3 |
| 5 | 15 | −32 | 25 | 57 | 10 |
| 6 | 7 | −55 | 1 | 56 | 6 |

As shown in Table 6, when the pH values of the CMP compositions range from 2 to 7, the SiO₂ films are negatively charged and the cationic silica is positively charged. As a result, there are attraction forces between SiO₂ films and cationic silica, which is believed to result in high RRs for SiO₂ films, as can be seen in Table 5 and FIG. 5. Conversely, both the SiN films and the cationic silica are positively charged (i.e., their ZPs are positive). As a result, there are repulsion forces between the SiN films and the cationic silica, which is believed to result in low RRs for SiN films, as can be seen in Table 5 and FIG. 5. Indeed, as shown in Table 5, the CMP compositions containing cationic silica abrasive exhibited high SiO₂ removal rates, low SiN removal rates, and relatively high SiO₂/SiN removal selectivity (i.e., preferentially removing SiO₂ over SiN).

In particular, Table 6 shows that, when the pH of the CMP compositions is from 4 to 5, the charge separation is the greatest between SiO₂ films and cationic silica. As a result, during this pH range, the SiO₂ RRs are the highest (between 962 A/min and 1015 A/min; see Table 5), indicating that due to greater charge separation, there are stronger forces of attraction between the negatively charged SiO₂ films and positively charged cationic silica, thereby leading to higher RRs for SiO₂ films. Conversely, Table 6 shows that, when the pH is 2, 3, and 4, the charge separation is the least between SiN films and cationic silica (both are positively charged). In this pH range, SiN films and cationic silica repel each other the most and thus provide the lowest SiN films RRs (i.e., 97 A/min, 85 A/min and 98 A/min respectively; see Table 5). Additionally, at relatively greater charge separation between SiN films and cationic silica at pH of 5 and 6 (charge separation of 10 and 6 mV, respectively; see Table 6), SiN films and cationic silica repel less and the SiN RRs are relatively high (i.e., 261 A/min and 244 A/min, respectively). This is consistent with the design of using charged abrasive-containing CMP compositions to achieve desired RRs and selectivities.

The CMP slurry compositions discussed in Example 3 containing cationic abrasives could be used in integrations where, on patterned wafers, a high selectivity ratio between SiO₂ and SiN films is desired. In the industry, these are typically referred to as Shallow Trench Isolation (STI) processes wherein, the silicon oxide film (an insulator) separates the conducting metal wires (such as copper, tungsten, or other metals/metal oxides), and the objective of the CMP process is to remove the SiO₂ films and stop-on SiN films on patterned wafers. There are many other FEOL and/or BEOL integration schemes where a high selectivity CMP composition of SiO₂ films over SiN films is required during the CMP process, and the cationic abrasive containing CMP compositions could be used in such schemes to polish heterogeneous materials on patterned wafers.

While the present disclosure has been described with reference to one or more exemplary embodiments, it will be understood by those skilled in the art that various changes may be made and equivalents may be substituted for elements thereof without departing from the scope of the present disclosure. Variations of the preferred embodiments mentioned herein may become apparent to those of ordinary skill in the art upon reading the foregoing descriptions. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims. Furthermore, the inventors expect skilled artisans to employ variations as appropriate to practice the disclosure in other forms than as specifically described herein. This includes all modifications and equivalents of the subject matter recited in the claims appended hereto as permitted by applicable law.

What is claimed is:
1. A polishing composition, comprising:
  a) a cationic abrasive comprising alumina, silica, titania, zirconia, a co-formed product thereof, or a mixture thereof, wherein the cationic abrasive comprises terminal groups of formula (I):

in which m is an integer from 1 to 3; n is an integer from 1 to 10; X is Al, Si, Ti, or Zr; and Y is a cationic amino or a cationic thiol group;
  b) an acid, a base, or a mixture thereof; and
  c) water;
    wherein the polishing composition has a pH of about 2 to about 7; the polishing composition is free of a cationic polymer, and the polishing composition has a zeta potential of from about +0.01 mV to about +100 mV; and wherein the composition has a first rate of removal of polysilicon, a second rate of removal of silicon nitride, and a ratio of the first rate to the second rate is at least about 10:1.

2. The composition of claim 1, wherein the composition has a first rate of removal of silicon oxide, a second rate of removal of silicon nitride, and a ratio of the first rate to the second rate is at least about 2:1.

3. The composition of claim 1, wherein the cationic abrasive is present in the composition in an amount of from about 1 wt% to about 5 wt% based on the total weight of the composition.

4. The composition of claim 1, wherein the cationic abrasive comprises colloidal alumina, colloidal silica, or colloidal titania.

5. The composition of claim 1, wherein the cationic abrasive comprises cationic colloidal silica, or base immobilized non-ionic silica.

6. The composition of claim 5, wherein the silica is prepared by a sol-gel reaction from tetramethyl orthosilicate or tetraethyl orthosilicate.

7. The composition of claim 1, wherein the cationic abrasive is present in the composition in an amount of from about 0.01 wt % to about 50 wt % based on the total weight of the composition.

8. The composition of claim 1, wherein the acid is selected from the group consisting of formic acid, acetic acid, malonic acid, citric acid, propionic acid, malic acid, adipic acid, succinic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, amino acetic acid, peracetic acid, potassium acetate, phenoxyacetic acid, glycine, bicine, diglycolic acid, glyceric acid, tricine, alanine, histidine, valine, phenylalanine, proline, glutamine, aspartic acid, glutamic acid, arginine, lysine, tyrosine, benzoic acid, nitric acid, sulfuric acid, sulfurous acid, phosphoric acid, phosphonic acid, hydrochloric acid, periodic acid, and mixtures thereof.

9. The composition of claim 1, wherein the base is selected from the group consisting of potassium hydroxide, sodium hydroxide, cesium hydroxide, ammonium hydroxide, triethanolamine, diethanolamine, monoethanolamine, tetrabutyl ammonium hydroxide, tetramethylammonium hydroxide, lithium hydroxide, imidazole, triazole, aminotriazole, tetrazole, benzotriazole, tolytriazole, pyrazole, isothiazole, and mixtures thereof.

10. The composition of claim 1, wherein the acid or base is present in the composition in an amount of from about 0.0001 wt % to about 30 wt % based on the total weight of the composition.

11. The composition of claim 1, wherein the cationic abrasive has a mean particle size of from about 1 nm to about 5000 nm.

12. The composition of claim 1, wherein the composition has a zeta potential of from about +5 mV to about +80 mV.

13. The composition of claim 1, wherein the composition has a conductivity of from about 0.01 mS/cm to about 100 mS/cm.

14. A method, comprising:
applying the polishing composition of claim 1 to a substrate having silicon nitride and at least one of silicon oxide and polysilicon on a surface of the substrate; and
bringing a pad into contact with the substrate and moving the pad in relation to the substrate;
wherein the method removes at least a portion of at least one of silicon oxide and polysilicon at a first rate, the method removes at least a portion of silicon nitride at a second rate, and a ratio of the first rate to the second rate is at least about 2:1.

15. The method of claim 14, wherein the ratio of the first rate to the second rate is at least about 10:1.

16. The method of claim 14, wherein the zeta potential difference between the polishing composition and silicon oxide or polysilicon is at least about 20 mV and the zeta potential difference between the polishing composition and silicon nitride is at most about 20 mV.

17. The method of claim 14, wherein the method removes substantially all of the at least one of silicon oxide and polysilicon on the substrate.

18. The method of claim 17, further comprises removing at least some of silicon nitride on the substrate.

19. The method of claim 14, wherein the substrate further comprises an additional material selected from the group consisting of metals, metal oxides, metal nitrides and dielectric materials.

20. The method of claim 14, further comprising producing a semiconductor device from the substrate treated by the polishing composition.

\* \* \* \* \*

UNITED STATES PATENT AND TRADEMARK OFFICE
CERTIFICATE OF CORRECTION

PATENT NO. : 11,034,861 B2
APPLICATION NO. : 16/535360
DATED : June 15, 2021
INVENTOR(S) : Abhudaya Mishra It is certified that error appears in the above-identified patent and that said Letters Patent is hereby corrected as shown below:

In the Claims

Column 22
Line 65, in Claim 1, delete "polymer," and insert -- polymer; -- therefor.

Column 23
Line 46 (Approx.), in Claim 9, delete "tetrabutyl ammonium" and insert -- tetrabutylammonium -- therefor.

Column 24
Line 2, in Claim 9, delete "tolytriazole," and insert -- tolyltriazole, -- therefor.

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*